US010477728B2

(12) United States Patent
Yatskov et al.

(10) Patent No.: US 10,477,728 B2
(45) Date of Patent: Nov. 12, 2019

(54) APPARATUS, SYSTEM, AND METHOD FOR COOLING DEVICES CONTAINING MULTIPLE COMPONENTS

(71) Applicant: Juniper Networks, Inc., Sunnyvale, CA (US)

(72) Inventors: Alexander I. Yatskov, Manteca, CA (US); Gautam Ganguly, San Jose, CA (US); Richard Singer, Menlo Park, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 15/854,840

(22) Filed: Dec. 27, 2017

(65) Prior Publication Data

US 2019/0200479 A1     Jun. 27, 2019

(51) Int. Cl.
*H05K 7/20*     (2006.01)
*F28F 13/00*     (2006.01)
(Continued)

(52) U.S. Cl.
CPC .......... *H05K 7/2039* (2013.01); *F28F 13/00* (2013.01); *H01L 23/3672* (2013.01); *H01L 23/4006* (2013.01); *F28F 2275/10* (2013.01)

(58) Field of Classification Search
CPC ....... H01L 2924/00; H01L 2224/32245; H01L 23/427; H01L 23/4006; H01L 2023/4062; H01L 2023/405; H01L 2023/4056; H01L 23/3677; G06F 1/206; G06F 1/20; H05K 7/20; H05K 1/0203; H05K 2201/066; H05K 7/20336; H05K 7/20727; H05K 7/209;
(Continued)

(56) References Cited

U.S. PATENT DOCUMENTS 6,212,074 B1 * 4/2001 Gonsalves .......... H01L 23/4006
                                                                165/185
6,625,025 B1 * 9/2003 Duxbury ............... H01L 23/367
                                                                  165/185
(Continued)

OTHER PUBLICATIONS

Yatskov et al.; Lid for Semiconductor Electronic Package; U.S. Appl. No. 15/848,627, filed Dec. 20, 2017.
(Continued)

*Primary Examiner* — Mandeep S Buttar
(74) *Attorney, Agent, or Firm* — FisherBroyles, LLP

(57) ABSTRACT

The disclosed apparatus may include (1) a base that (A) supports multiple heatsinks and (B) is coupled to a device that includes (i) a first component designed to operate at temperatures below a first threshold temperature and (ii) a second component designed to operate at temperatures below a second threshold temperature, the first threshold temperature being different than the second threshold temperature, (2) a first heatsink that (A) is secured to the base and (B) transfers heat away from the first component such that the first component operates at a temperature below the first threshold temperature, and (3) a second heatsink that is (A) secured to the base, (B) physically separated from the first heatsink by at least a certain amount of space, and (C) transfers heat away from the second component such that the second component operates at a temperature below the second threshold temperature.

20 Claims, 5 Drawing Sheets

(51) Int. Cl.
*H01L 23/367* (2006.01)
*H01L 23/40* (2006.01)

(58) Field of Classification Search
CPC .. H05K 1/0201; H05K 1/0204; H05K 7/2039; H05K 7/20154; H05K 7/20309; F28F 13/00; F28F 2275/10
USPC .......... 361/679.54, 697, 709, 704, 720, 718, 361/702, 719; 165/80.3, 104.33
See application file for complete search history.

(56) References Cited

U.S. PATENT DOCUMENTS

| | | | | |
|---|---|---|---|---|
| 7,224,582 | B1* | 5/2007 | Saturley | G06F 1/20 361/679.54 |
| 9,198,328 | B1* | 11/2015 | Kokas | H05K 7/20518 |
| 2003/0193777 | A1* | 10/2003 | Friedrich | G06F 1/206 361/679.53 |
| 2009/0223647 | A1* | 9/2009 | Alousi | F28D 15/0233 165/80.3 |
| 2010/0288470 | A1* | 11/2010 | Chen | H01L 23/367 165/80.3 |
| 2016/0118315 | A1* | 4/2016 | Smith | H01L 23/3672 257/713 |
| 2016/0146047 | A1* | 5/2016 | Waldron | F02B 37/00 416/1 |

OTHER PUBLICATIONS

Yatskov et al.; Lid for Semiconductor Electronic Package; U.S. Appl. No. 62/476,502, filed Mar. 24, 2017.

Mikjaniec et al. ; Apparatus, System, and Method for Improved Heat Spreading in Heatsinks ; U.S. Appl. No. 15/432,195, filed Feb. 14, 2017.

Lucas; Apparatus, System, and Method for Improving the Thermal Conduction of Heat Sinks; U.S. Appl. No. 15/681,333, filed Aug. 18, 2018.

Yatskov; Apparatus, System, and Method for Mitigating Electromagnetic Radiation Leaks in Double-Decker Heatsinks ; U.S. Appl. No. 15/937,781, filed Mar. 27, 2018.

* cited by examiner

APPARATUS, SYSTEM, AND METHOD FOR COOLING DEVICES CONTAINING MULTIPLE COMPONENTS

Heatsinks are often a critical component of electronic and mechanical devices. For example, power dissipated by a device may generate heat, thereby causing the operating temperature of the device to rise. If the operating temperature increases above a certain level, components of the device may overheat, malfunction, or even break. As such, many devices may be equipped with heatsinks designed to transfer and/or dissipate heat. In general, a heatsink may contain and/or represent a thermally conductive material that transfers heat away from an operational device, thereby cooling the device and/or enabling the device to achieve optimal performance.

The operating temperature of a device may generally correlate to the amount of power dissipated by the same. As technological advancements increase the amount of power certain devices (such as microprocessors and integrated circuits) are capable of dissipating, such devices may need and/or call for more efficient and/or effective heatsinks. This problem may be exacerbated or compounded in devices that contain multiple components. For example, a multi-chip module that contains two distinct integrated circuits may generate a larger amount of heat than a simpler device containing a single integrated circuit.

Moreover, the different components of a multi-chip module may have different cooling needs. For example, in a device that contains an Application-Specific Integrated Circuit (ASIC) and a high-bandwidth memory (HBM) chip, the HBM chip may be designed to operate at a lower temperature than the ASIC. Traditional heatsink systems may attempt to lower the operating temperature of both components to the temperature required by the HBM chip. Unfortunately, accomplishing this task may be difficult, expensive, or even impossible using conventional heatsink technologies. For example, a heatsink capable of cooling a device component to a temperature far below its allowable operating temperature may require a prohibitively large amount of space and/or cost.

The instant disclosure, therefore, identifies and addresses a need for additional and improved apparatuses, systems, and methods for cooling devices containing multiple components.

SUMMARY

As will be described in greater detail below, the instant disclosure generally relates to apparatuses, systems, and methods for cooling devices containing multiple components. In one example, an apparatus for accomplishing such a task may include (1) a base that is (A) capable of supporting multiple heatsinks and (B) coupled to a device that includes (i) a first component designed to operate at temperatures below a first threshold temperature and (ii) a second component designed to operate at temperatures below a second threshold temperature, the first threshold temperature being different than the second threshold temperature, (2) a first heatsink that (A) is secured to the base and (B) transfers heat away from the first component such that the first component operates at a temperature below the first threshold temperature, and (3) a second heatsink that is (A) secured to the base, (B) physically separated from the first heatsink by at least a certain amount of space, and (C) transfers heat away from the second component such that the second component operates at a temperature below the second threshold temperature.

Similarly, a system incorporating the above-described apparatus may include (1) a multi-chip module that includes (A) a first module designed to operate at temperatures below a first threshold temperature and (B) a second module designed to operate at temperatures below a second threshold temperature, the first threshold temperature being different than the second threshold temperature, (2) a base that is capable of supporting multiple heatsinks and that is coupled to the multi-chip module, (3) a first heatsink that (A) is secured to the base and (B) transfers heat away from the first module such that the first module operates at a temperature below the first threshold temperature, and (4) a second heatsink that (A) is secured to the base, (B) is physically separated from the first heatsink by at least a certain amount of space, and (C) transfers heat away from the second module such that the second module operates at a temperature below the second threshold temperature.

A corresponding method may include (1) securing, to a base capable of supporting multiple heatsinks, a first heatsink designed to transfer heat away from a first component of a device, the first component being designed to operate at temperatures below a first threshold temperature, (2) securing, to the base, a second heatsink that is (A) physically separated from the first heatsink by at least a certain amount of space and (B) designed to transfer heat away from a second component of the device, the second component being designed to operate at temperatures below a second threshold temperature that is different from the first threshold temperature, and (3) coupling the base to the device such that (A) the first component operates at a temperature below the first threshold temperature and (B) the second component operates at a temperature below the second threshold temperature.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
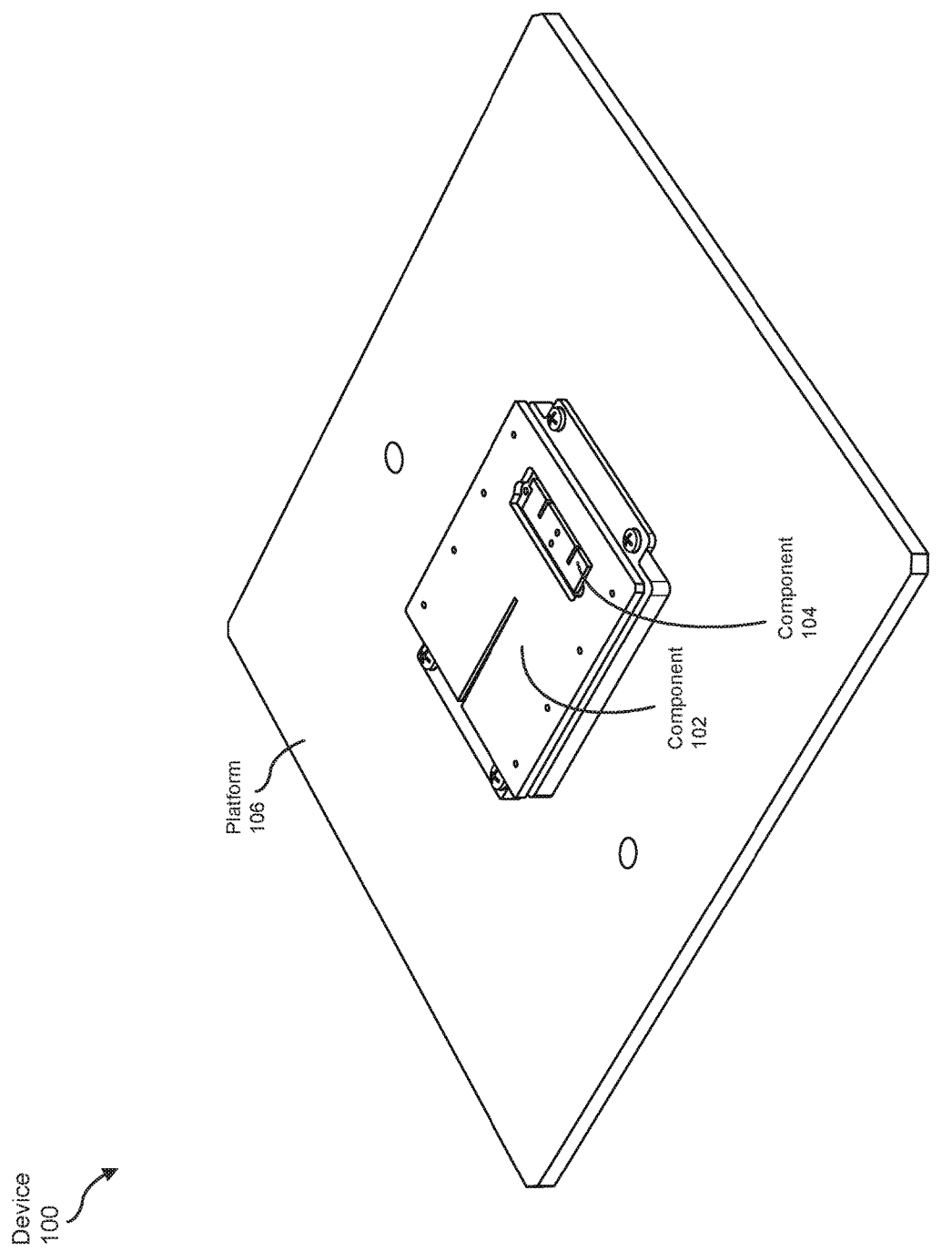
FIG. 1 is an illustration of an exemplary multi-chip module.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for cooling devices containing multiple components. As will be explained in greater detail below, embodiments of the instant disclosure may enable each component of a device (such as a multi-chip module) to operate at or below its threshold operating temperature. For example, the disclosed heatsink apparatuses may independently and/or individually cool separate components of a device such that the components operate at different temperatures. To accomplish this task, the disclosed embodiments may incorporate multiple heatsinks into a single heat-dissipating mechanism. This mechanism may represent a "double-decker" heatsink system that contains two or more distinct heatsinks, each of which are coupled to and designed to cool separate components of a device.

In some embodiments, the heatsinks within the disclosed heatsink apparatuses may be separated from each other by a certain distance (i.e., clearance) to prevent or minimize thermal crosstalk between the heatsinks, thereby enabling different components of a device to operate at different temperatures. Furthermore, the heatsinks may be independently mounted via separate spring systems. These spring systems may be designed to ensure proper physical contact between each component of a device and the heatsink that is dedicated to cooling the component. In contrast to traditional heatsink systems (e.g., systems involving a single heatsink), embodiments of the instant disclosure may enable devices with multiple heat-generating components to safely and efficiently operate at ideal temperatures.

The following will provide, with reference to FIG. 1, a detailed description of multi-chip modules. The discussion corresponding to FIG. 2 will provide a detailed description of apparatuses for cooling devices containing multiple components. In addition, the discussions corresponding to FIGS. 3 and 4 will provide detailed descriptions of systems for cooling devices containing multiple components. Finally, the discussion corresponding to FIG. 5 will provide a detailed description of an exemplary method for cooling devices containing multiple components.

FIG. 1 illustrates an exemplary device 100. Device 100 generally represents any type or form of mechanical and/or electrical device containing one or more components. These components may operate independently or in conjunction with one another. In one embodiment, device 100 may represent a multi-chip module. The term "multi-chip module," as used herein, generally refers to any type or form of electronic device or assembly that contains at least two distinct chips, integrated circuits, semiconductor dies, and/or other type of component.

In the example of FIG. 1, device 100 may represent a multi-chip module that includes a component 102 and a component 104. These components may be secured on a platform 106. In one example, component 102 may represent one type of semiconductor die (e.g., an ASIC) and component 104 may represent a different type of semiconductor die (e.g., an HBM chip). In general, device 100 may contain any number and/or any type of heat-generating components.

In some examples, the components of device 100 may be designed to operate at or below certain operating temperatures. For example, the performance and/or reliability of one or more components within device 100 may be impaired as the operating temperature of the components rises beyond a certain threshold temperature. Because component 102 and component 104 may contain different materials and/or perform different functions, the threshold operating temperature of component 102 may differ from the threshold operating temperate of component 104. As an example, component 102 may have a threshold operating temperature of 115° C., while component 104 has a threshold operating temperature of 95° C. In this example, to ensure proper operation of device 100, the temperature of each of components 102 and 104 must be kept at or below their respective threshold temperatures.

Figure 2:
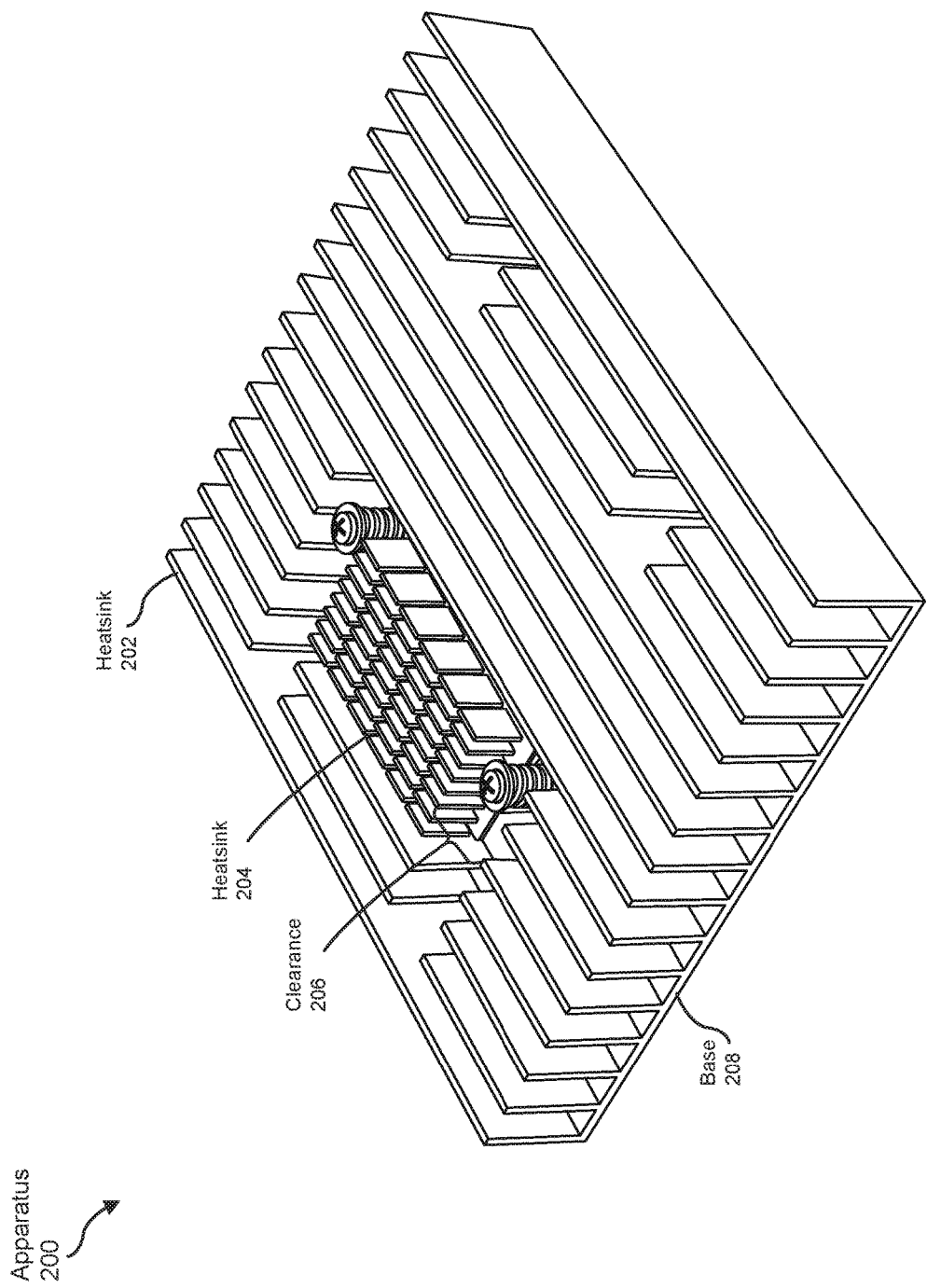
FIG. 2 is an illustration of an exemplary apparatus for cooling devices containing multiple components.

FIG. 2 illustrates an exemplary apparatus 200 that enables each component of device 100 to operate at or below its respective threshold temperature. Apparatus 200 generally represents any structure or assembly that incorporates one or more heatsinks designed to transfer heat away from components 102 and 104. The term "heatsink," as used herein, generally refers to any type or form of system, device, structure, and/or mechanism that conducts, transfers, absorbs, and/or sinks heat. Heatsinks may include and/or contain a variety of materials. Examples of such heatsink materials include, without limitation, copper, aluminum, diamond, alloys of one or more of the same, combinations or variations of one or more of the same, and/or any other suitable materials.

In some examples, a heatsink may contain and/or be composed of a series of ridges or corrugations extending from a base. This configuration may increase the surface area of the conductive material within the heatsink, thereby increasing the amount of heat dissipated by the same. Heatsinks may also include any additional or alternative structure designed to facilitate heat dissipation, such as wicks and/or vapor chambers.

As shown in FIG. 2, apparatus 200 may include a heatsink 202 and a heatsink 204. In one embodiment, each heatsink within apparatus 200 may be dedicated to cooling a particular component of device 100. For example, when apparatus 200 in FIG. 2 is applied to device 100 in FIG. 1, heatsink 202 may transfer heat away from component 102, while heatsink 204 transfers heat away from component 104. Alternatively, heatsink 202 and/or heatsink 204 may transfer heat away from both components 102 and 104.

In some examples, heatsink 202 may be substantially the same as or similar to heatsink 204. For example, heatsink 202 and heatsink 204 may be composed of the same materials and/or each contain the same components (such as vapor chambers). In other examples, heatsink 202 and heatsink 204 may differ in one or more characteristics. For example, the size and/or configuration of heatsink 202 may be designed to ensure that component 102 maintains a certain operating temperature and the size and/or configuration of heatsink 204 may be independently designed to ensure that component 104 maintains a different operating temperature.

In the example of FIG. 2, heatsink 202 and heatsink 204 are both mounted on and/or secured to a base 208. In one embodiment, base 208 may represent a portion of heatsink 202. For example, heatsink 202 may be composed of base 208 and ridges extending from base 208 that facilitate heat dissipation. In this example, heatsink 204 may be coupled to base 208 (i.e. within an area that does not contain the ridges of heatsink 202). In one embodiment, heatsink 204 may be secured and/or inserted into an opening within base 208. In this way, at least a portion of heatsink 204 may be exposed and/or accessible underneath base 208. In some examples, the opening of base 208 may be dimensioned and/or sized based on the dimensions of component 104. For example, this opening may correspond to the size of component 104 such that heatsink 204 makes physical contact with component 104 (rather than component 102) when apparatus 200 is coupled to device 100.

In some embodiments, heatsink 204 may be directly coupled to base 208. Alternatively, heatsink 204 may be indirectly coupled to base 208 (e.g., via one or more additional layers or components). For example, apparatus 200 may include an insulating layer (e.g., a vacuum or slug). This insulating layer may be part of heatsink 204 and/or coupled to heatsink 204. The insulating layer may prevent or minimize undesirable heat transfer between certain components of apparatus 200 and device 100, such as between heatsink 204 and component 102.

In the example of FIG. 2, heatsink 204 is encompassed and/or surrounded by heatsink 202. In general, heatsink 202 and heatsink 204 may be arranged in any suitable or alternative manner with respect to one another (e.g., based on the arrangement of components 102 and 104 on device 100). For example, heatsink 202 may be adjacent to heatsink 204. Alternatively, heatsink 202 may be on top of or below heatsink 204. In a further example, only a portion of heatsink 202 (as opposed to the entirety of heatsink 202) may be surrounded by heatsink 204. Moreover, apparatus 200 may include one or more additional heatsinks not illustrated in FIG. 2.

In some embodiments, heatsink 202 and heatsink 204 may be separated by a certain amount of space. For example, heatsink 202 and heatsink 204 may be positioned such that no side of heatsink 204 is within a certain distance from heatsink 202. In the example of FIG. 2, each side of heatsink 204 may be physically separated from heatsink 202 by at least a clearance 206. Clearance 206 may be of any suitable size (e.g., 0.025 inches or 0.5 centimeters). The space representing clearance 206 may be empty (e.g., air) or filled with any suitable insulating material. In some examples, clearance 206 may prevent at least a portion of the heat stored within and/or transferred to heatsink 202 from transferring to heatsink 204 (and vice versa). For example, the size of clearance 206 may be selected to block or minimize thermal crosstalk between heatsink 202 and heatsink 204. In this way, heatsink 202 and heatsink 204 may enable component 102 and component 104 to operate at different operating temperatures.

Figure 3:
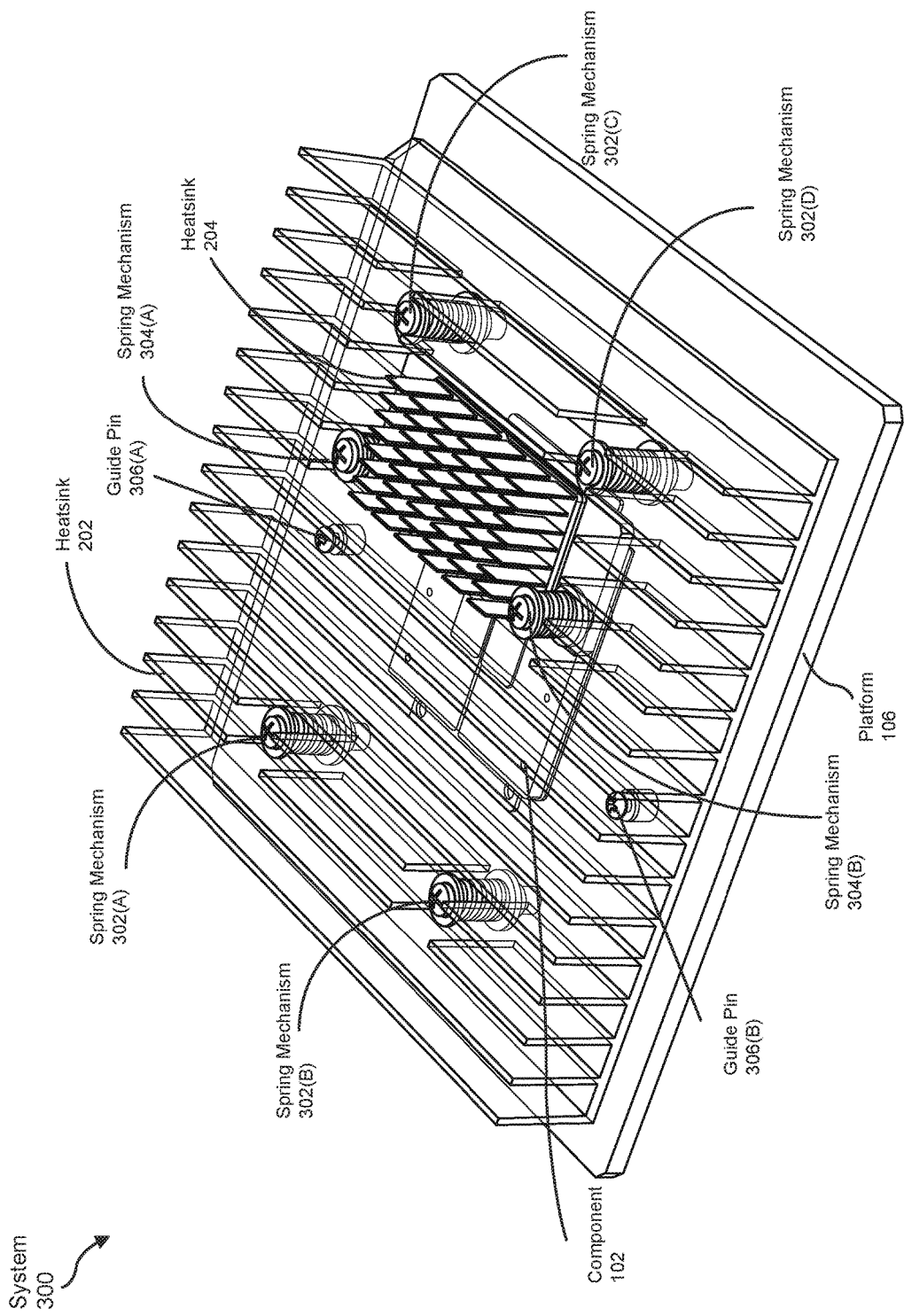
FIG. 3 is illustration of an exemplary system for cooling devices containing multiple components.

Apparatus 200 may be coupled to device 100 in a variety of ways. FIG. 3 shows a system 300 that illustrates an exemplary configuration of device 100 and the heatsinks of apparatus 200. In this example, heatsink 202 is depicted transparently to illustrate components of system 300 underneath heatsink 202.

As shown in FIG. 3, each of heatsink 202 and heatsink 204 may be coupled to device 100 and/or apparatus 200 via one or more spring mechanisms. Specifically, heatsink 202 may be coupled to platform 106 via spring mechanisms 302(A-D) and heatsink 204 may be coupled to base 208 via spring mechanisms 304(A) and 304(B). These spring mechanisms may include a variety of components or devices, such as a spring (e.g., a coil spring, extension spring, or any additional type of spring), a screw or bolt, an O-ring, a washer, and/or any other type of support or fastener.

In the example of FIG. 3, each of spring mechanisms 302(A-D) may be inserted into holes or openings within heatsink 202 and corresponding holes or openings within platform 106. When spring mechanisms 302(A-D) are secured within these holes, spring mechanisms 302(A-D) may ensure that heatsink 202 makes physical contact with component 102. For example, spring mechanisms 302(A-D) may press heatsink 202 against all or a portion of component 102 with enough force to enable sufficient and/or maximum heat conduction between component 102 and heatsink 202. In one embodiment, the stiffness (e.g., spring constant value) of the springs within spring mechanisms 302(A-D) may be selected at least in part to enable spring mechanisms 302(A-D) to provide this force.

Similarly, spring mechanisms 304(A-B) may secure at least a portion of heatsink 204 against all or a portion of component 104. In the example of FIG. 3, spring mechanisms 304(A-B) are coupled to a platform that supports heatsink 204. Spring mechanisms 304(A-B) may secure this platform to base 208 of apparatus 200. In this way, spring mechanisms 304(A-B) may facilitate physical contact between at least a portion of heatsink 204 and component 104. For example, as explained above, the bottom surface of heatsink 204 may be exposed via an opening within base 208. Securing heatsink 204 within this opening (e.g., via spring mechanisms 304(A-B)) may enable heat transfer between component 104 and heatsink 204.

In some embodiments, the spring constant value of springs within spring mechanisms 304(A-B) may be selected at least in part to enable sufficient physical contact and/or heat transfer between component 104 and heatsink 204. In some examples, the spring constant value of springs within spring mechanisms 304(A-B) may differ from the spring constant values of springs within spring mechanisms 302(A-D). For example, component 102 and component 104 may be of different heights (e.g., component 102 may extend farther from platform 106 than component 104). This deviation in co-planarity may be the result of manufacturing tolerances and/or the dimensions of components 102 and 104. To ensure that both component 102 and component 104 are pressed securely against heatsink 202 and heatsink 204, respectively, the spring constants of spring mechanisms 302(A-D) and the spring constants of spring mechanisms 304(A-B) may be independently selected.

In some examples, heatsink 204 may be coupled to base 208 via a tolerance ring or similar friction-based securing mechanism. This tolerance ring may hold heatsink 204 within the opening of base 208, thereby preventing movement of heatsink 204 relative to heatsink 202. In this way, the tolerance ring may maintain clearance 206 between heatsink 202 and heatsink 204. In one embodiment, the tolerance ring may represent and/or be composed of a radial spring that securely fits into the opening of base 208.

As shown in FIG. 3, system 300 may include one or more guide pins, such as guide pins 306(A) and 306(B). Guide pins 306(A-B) generally represent any fastening mechanism that secures apparatus 200 to device 100. As such, guide pins 306(A-B) may prevent movement of heatsinks 202 and 204 relative to components 102 and 104. In general, the components of apparatus 200 and device 100 may be coupled together and/or secured via any combination of spring mechanisms, guide pins, tolerance rings, and/or other type of fastening mechanism.

In some examples, system 300 may include one or more additional elements designed to facilitate heat transfer between device 100 and apparatus 200. For example, component 102 and/or component 104 may be coupled to or equipped with a thermal interface material (e.g., a thermally-conductive layer or covering). These thermal interface materials may facilitate physical contact and/or heat conduction between components 102 and 104 and heatsinks 202 and 204.

In some embodiments, the thermal interface material coupled to component 102 may differ from the thermal interface material coupled to component 104. For example, the thermal interface material coupled to each component may be selected based on the thermal properties of the individual components, and therefore may not necessarily be the same for each component. In some examples, the spring constant of the spring mechanisms coupled to each component may also be selected based at least in part on the thermal interface materials that cover the components. For example, the spring constant of the springs within spring mechanisms 302(A-D) may be selected based at least in part on the thickness of the thermal interface material coupled to component 102.

Figure 4:
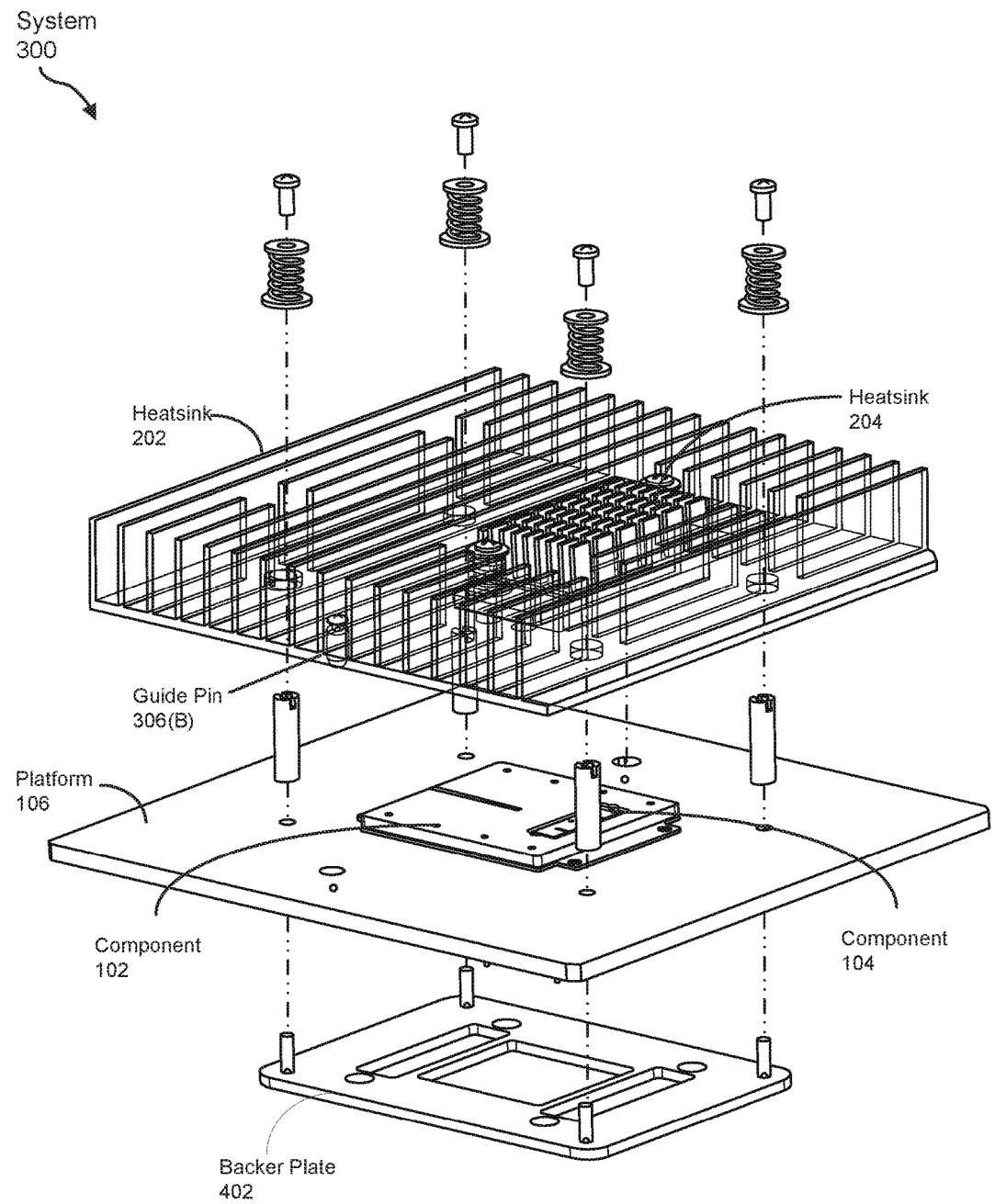
FIG. 4 is an illustration of an additional exemplary system for cooling devices containing multiple components.

FIG. 4 illustrates an expanded and/or exploded view of system 300. Specifically, FIG. 4 shows how the components of system 300 may be arranged and/or secured relative to one another. In addition to the components illustrated in FIG. 3, FIG. 4 shows a backer plate 402. Backer plate 402 generally represents any platform, sheet, and/or fastener that couples system 300 to a load or other structure.

Figure 5:
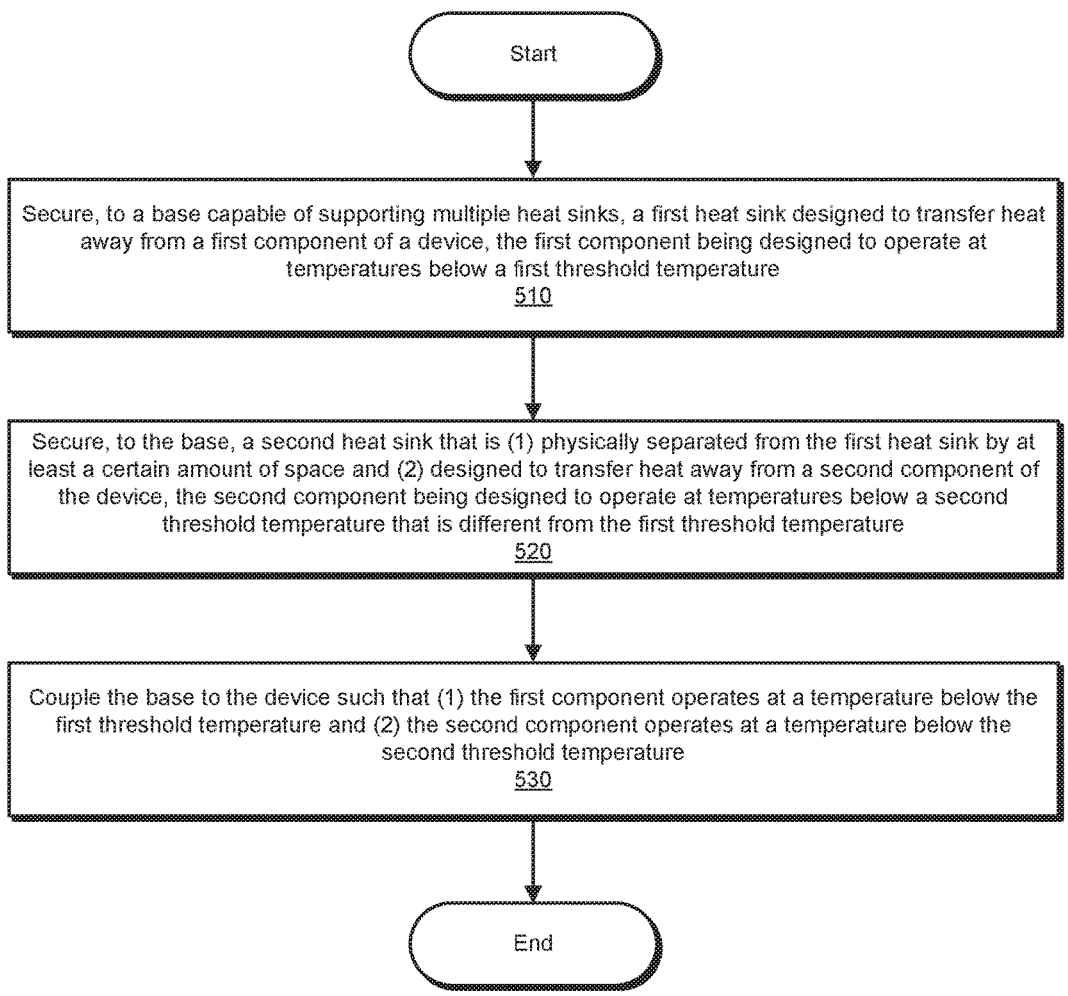
FIG. 5 is a flow diagram of an exemplary method for cooling devices containing multiple components.

FIG. 5 is a flow diagram of an exemplary method 500 for cooling devices containing multiple components. Method 500 may include the step of securing, to a base capable of supporting a plurality of heatsinks, a first heatsink designed to transfer heat away from a first component of a device, the first component being designed to operate at temperatures below a first threshold temperature (510). In one example, the first component may represent a chip (e.g., an ASIC chip) within a multi-chip module.

Step 510 may be performed in a variety of ways. For example, a multi-chip module manufacturer may machine and/or assemble the components of heatsink 202, including base 208 and/or spring mechanisms 302(A-D). In one embodiment, the multi-chip module manufacturer may design and then manufacture heatsink 202 to be capable of physically contacting and transferring heat away from component 102 of device 100.

Method 500 may also include the step of securing, to the base, a second heatsink that is (1) physically separated from the first heatsink by at least a certain amount of space and (2) designed to transfer heat away from a second component of the device, the second component being designed to operate at temperatures below a second threshold temperature that is different from the first threshold temperature (520). In one example, the second component may represent a different chip (e.g., an HBM chip) within the multi-chip module.

Step 520 may be performed in a variety of ways. For example, the multi-chip module manufacturer may secure heatsink 204 within and/or beside heatsink 202. Specifically, the manufacturer may secure heatsink 204 within an opening of base 208. In addition, the manufacturer may ensure that all or a portion of the sides of heatsink 204 are at least a certain distance away from heatsink 202. In this way, the manufacturer may ensure that heatsink 204 is capable of transferring heat away from component 104 of device 100 while also preventing heat from transferring between heatsink 202 and heatsink 204. In some embodiments, the manufacturer may couple heatsink 204 to base 208 via spring mechanisms 304(A-B), which are independent from spring mechanisms 302(A-D).

Returning to FIG. 5, method 500 may also include the step of coupling the base to the device such that (1) the first component operates at a temperature below the first threshold temperature and (2) the second component operates at a temperature below the second threshold temperature (530).

Step 530 may be performed in a variety of ways. For example, the multi-chip module manufacturer may secure (e.g., via spring mechanisms 302(A-D)) heatsinks 202 and 204 to device 100. Specifically, the manufacturer may position apparatus 200 over device 100 such that all or a portion of component 102 physically contacts heatsink 202 and all or a portion of component 104 physically contacts heatsink 204. In this way, heatsinks 202 and 204 may individually and/or independently cool components 102 and 104, enabling each component to operate at its own ideal operating temperature.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a base capable of supporting a plurality of heatsinks that:
      is coupled to a device that comprises:
         a first component designed to operate at temperatures below a first threshold temperature; and
         a second component that is:
            positioned in an opening within the first component such that the second component is surrounded by the first component; and designed to operate at temperatures below a second threshold temperature, the first threshold temperature being higher than the second threshold temperature;

a first heatsink that:
  is secured to the base; and
  transfers heat away from the first component such that the first component operates at a temperature below the first threshold temperature; and a second heatsink that:
  is secured to the base;
  transfers heat away from the second component;
  includes a plurality of sides that extend from the base; and
  is at least partially thermally isolated from the first heatsink by a region of empty space that:
    is located between each side of the second heatsink that extends from the base and the first heatsink such that the second heatsink is surrounded by the first heatsink; and
    is dimensioned to reduce heat transfer between the first heatsink and the second heatsink such that the second component operates at a temperature below the second threshold temperature.

2. The apparatus of claim 1, wherein:
the first component transfers heat to the first heatsink via conduction through the base; and
the second component transfers heat to the second heatsink via an opening in the base that enables the second component to physically contact the second heatsink.

3. The apparatus of claim 1, wherein the second heatsink is further thermally isolated from the first heatsink by an insulating material coupled to at least one side of the first heatsink.

4. The apparatus of claim 1, wherein:
the first heatsink is secured to the base via at least one spring; and
the second heatsink is secured to the base via at least one additional spring.

5. The apparatus of claim 4, wherein:
the spring is coupled to the base and the first heatsink such that the spring facilitates physical contact between the first component and the first heatsink when the device is coupled to the base;
the additional spring is coupled to the base and the second heatsink such that the additional spring facilitates physical contact between the second component and the second heatsink when the device is coupled to the base;
a spring constant value of the spring is selected to enable physical contact sufficient for heat, transfer between the first component and the first, heatsink when the device is coupled to the base; and
a spring constant value of the additional spring is selected to enable physical contact sufficient for heat transfer between the second component and the second heatsink when the device is coupled to the base.

6. The apparatus of claim 1, further comprising a tolerance ring that:
secures the second heatsink to the base; and
maintains the region of empty space between the first heatsink and the second heatsink.

7. The apparatus of claim 6, wherein the tolerance ring comprises a radial spring that is:
coupled to the second heatsink; and
inserted into an opening within the base.

8. The apparatus of claim 1, further comprising:
a thermal interface material that is coupled to the first component and facilitates heat transfer between the first component and the first heatsink; and
an additional thermal interface material that is coupled to the second component and is different than the thermal interface material coupled to the first component.

9. The apparatus of claim 1, wherein:
the first component comprises a microprocessor; and
the second component comprises a data storage device.

10. The apparatus of claim 1, wherein the first heatsink operates at a different temperature than the second heatsink.

11. The apparatus of claim 1, wherein the region of empty space located between each side of the second heatsink that extends from the base and the first heatsink prevents at least a certain amount of heat generated by the second component from transferring to the first heatsink.

12. A system comprising:
a multi-chip module comprising:
  a first module designed to operate at temperatures below a first threshold temperature; and
  a second module that is:
    positioned in an opening within the first module such that the second module is surrounded by the first module; and
    designed to operate at temperatures below a second threshold temperature, the first threshold temperature being higher than the second threshold temperature;
a base that is capable of supporting a plurality of heatsinks and that is coupled to the multi-chip module;
a first heatsink that:
  is secured to the base; and
  transfers heat away from the first module such that the first module operates at a temperature below the first threshold temperature; and
a second heatsink that:
  is secured to the base;
  transfers heat away from the second module;
  includes a plurality of sides that extend from the base; and
  is at least partially thermally isolated from the first heatsink by a region of empty space that:
    is located between each side of the second heatsink that extends from the base and the first heatsink such that the second heatsink is surrounded by the first heatsink; and
    is dimensioned to reduce heat transfer between the first heatsink and the second heatsink such that the second module operates at a temperature below the second threshold temperature.

13. The system of claim 12, wherein:
the first module transfers heat to the first, heatsink via conduction through the base; and
the second module transfers heat to the second heatsink via an opening in the base that enables the second module to physically contact, the second heatsink.

14. The system of claim 12, wherein the second heatsink is further thermally isolated from the first heatsink by an insulating material coupled to at least one side of the first heatsink.

15. The system of claim 12, wherein:
the first heatsink is secured to the base via at least one spring; and
the second heatsink is secured to the base via at least one additional spring.

16. The system of claim 15, wherein:
the spring is coupled to the base and the first heatsink such that the spring facilitates physical contact between the first module and the first heatsink when the multi-chip module is coupled to the base;
the additional spring is coupled to the base and the second heatsink such that the additional spring facilitates physical contact between the second module and the second heatsink when the multi-chip module is coupled to the base;
a spring constant value of the spring is selected to enable physical contact sufficient for heat transfer between the first module and the first heatsink when the multi-chip module is coupled to the base; and
a spring constant value of the additional spring is selected to enable physical contact sufficient for heat transfer between the second module and the second heatsink when the multi-chip module is coupled to the base.

17. The system of claim 12, further comprising a tolerance ring that:
secures the second heatsink to the base; and
maintains the region of empty space between the first heatsink and the second heatsink.

18. The system of claim 17, wherein the tolerance ring comprises a radial spring that is:
coupled to the second heatsink; and
inserted into an opening within the base.

19. The system of claim 12, further comprising:
a thermal interface material that is coupled to the first module and facilitates heat transfer between the first module and the first heatsink; and
an additional thermal interface material that is coupled to the second module and is different than the thermal interface material coupled to the first module.

20. A method comprising:
securing, to a base capable of supporting a plurality of heatsinks, a first heatsink designed to transfer heat away from a first component of a device, the first component being designed to operate at temperatures below a first threshold temperature;
securing, to the base, a second heatsink that:
is designed to transfer heat away from a second component of the device, the second component being:
designed to operate at temperatures below a second threshold temperature that is different from the first threshold temperature; and
positioned in an opening within the first component such that the second component is surrounded by the first component;
includes a plurality of sides that extend from the base; and
is at least partially thermally isolated from the first heatsink by a region of empty space that:
is located between each side of the second heatsink that extends from the base and the first heatsink such that the second heatsink is surrounded by the first heatsink; and
is dimensioned to reduce heat transfer between the first heatsink and the second heatsink;
coupling the base to the device such that:
the first component operates at a temperature below the first threshold temperature; and
the second component operates at a temperature below the second threshold temperature.

* * * * *